US008821748B1

(12) United States Patent
Hackenberger et al.

(10) Patent No.: US 8,821,748 B1
(45) Date of Patent: Sep. 2, 2014

(54) HIGH ENERGY DENSITY SHOCK DISCHARGE MATERIALS

(75) Inventors: Wesley S. Hackenberger, State College, PA (US); Edward F. Alberta, State College, PA (US)

(73) Assignee: TRS Technologies, Inc., State College, PA (US)

( * ) Notice: Subject to any disclaimer, the term of this patent is extended or adjusted under 35 U.S.C. 154(b) by 964 days.

(21) Appl. No.: 12/945,655

(22) Filed: Nov. 12, 2010

Related U.S. Application Data

(60) Provisional application No. 61/261,012, filed on Nov. 13, 2009.

(51) Int. Cl.
*C04B 35/00* (2006.01)
*H01L 41/00* (2013.01)
*H02N 2/00* (2006.01)
*H01L 41/187* (2006.01)

(52) U.S. Cl.
CPC .................................. *H01L 41/1876* (2013.01)
USPC ...................... 252/62.9 PZ; 501/136; 310/363

(58) Field of Classification Search
CPC ..................... C04B 2235/3232; C04B 35/491; C04B 35/49; C04B 35/472; H01L 27/11502; H01L 28/55
USPC .............. 501/135, 136; 252/62.9 R, 62.9 PZ; 257/295; 310/363
See application file for complete search history.

(56) References Cited

U.S. PATENT DOCUMENTS

| | | | |
|---|---|---|---|
| 4,412,148 A | 10/1983 | Klicker et al. | |
| 4,830,996 A * | 5/1989 | Hirai et al. | 501/136 |
| 5,702,629 A * | 12/1997 | Cui et al. | 252/62.9 R |
| 6,685,849 B2 | 2/2004 | Eitel et al. | |
| 7,989,530 B2 | 8/2011 | Tan et al. | |
| 8,148,877 B2 | 4/2012 | Jiang et al. | |
| 2011/0074249 A1 | 3/2011 | Sakashita et al. | |
| 2012/0145943 A1 | 6/2012 | Tan et al. | |

FOREIGN PATENT DOCUMENTS

JP 72022518 B 7/1972

OTHER PUBLICATIONS

Yoon et al. Effect of Pb(Yb1/2Nb1/2)O3 on structural and piezoelectric properties of Pb(Zr0.52Ti0.48)O3 ceramics. Journal of Applied Physics, vol. 88, No. 6, Sep. 15, 2000. p. 3596-3600.*
Fan et al. Preparation and improvement in the electrical properties of lead-zinc-niobate-based ceramics by thermal treatments. J. Mater. Res., vol. 17, No. 1, Jan. 2002.*
Riedel et al. Ceramics Science and Technology, vol. 2—Materials and Properties. p. 280-282. Wiley-VCH, 2010.*
Kempa et al. Bulk dielectric and magnetic properties of PFW-PZT ceramics: absence of magnetically switched-off polarization. J. Phys.: Condens. Matter 22 (2010) 445902.*
Altgilbers, L.L., "Recent Advances in Explosive Pulsed Power," Electromagnetic Phenomena V.3, No. 4 (12), (2003) U.S. Army Space and Missile Defense Command, Huntsville, AL.
Ng et al., "Piezoelectric and Pyroelectric Properties of PZT/P(VDF-TrFE) Composites with Constituent Phases Poled in Parallel or Antiparallel Directions," IEEE Transactions on Ultrasonic, Ferroelectrics, and Frequency Control, vol. 47, No. 6, Nov. 2000, pp. 1308-1315.
Zeuch et al., "Uniaxial compression experiments on lead zirconate titanate 95/5-2Nb ceramic: Evidence for an orientation-dependent, 'maximum compressive stress' criterion for onset of the ferroelectric to antiferroelectric polymorphic transformation," J. Mater, Res., vol. 15, No. 3, Mar. 2000, pp. 689-703.
Hwang et al., "Low-Temperature Sintering and High Strength Pb(Zr,Ti)O3-Matrix Composites Incorporating Silver Particles," J. Am. Ceram. Soc., 80, 3, 1997 (no month date), pp. 791-793.
Yoshikawa et al., "Piezoelectric PZT Tubes and Fibers for Passive Vibrational Damping," Proceedings of the Eighth IEEE International Symposium on Applications of Ferroelectrics, 1992, ISAF '92, Aug. 30-Sep. 2, 1992, pp. 269-272.
D. Berlincourt, H. H. A. Krueger and B. Jaffe, "Stability of Phases in Modified Lead Zirconate with Variation in Pressure, Electric Field", Temperature and Composition Electronic Research Division, Clevite Corporation, Cleveland, Ohio (in revised form Nov. 22, 1963) J. Phys. Chem. Solids Pergamon Press 1964. vol. 25, pp. 659-674. Printed in Great Britain.
Masaru Yokosuka and Hidehiko Kojima, "Dielectric and Piezoelectric Properties of the Solid Solution System Pb(Fe2/3 WI/3)03—PbZr03", Jpn. J. Appl. Phys. vol. 36 (1997) pp. 6046-6050 Part 1, No. 9B, Sep. 1997; accepted for publication Jul. 4, 1997 Faculty of Science and Engineering, Iwaki-Meisei University, Iwaki, Fukushima 970, Japan.
R. H. Dungan, H. M. Barnett, and A. H. Stark, "Phase Relations and Electrical Parameters in the Ferroelectric-Antiferroelectric Region of the System PbZrO3—PbTiO3—PbNb2O6", Journal of The American Ceramic Society—Dungan et al. vol. 45, No. 8, Sandia Corporation, Albuquerque, New Mexico, Jun. 2006.
C. E. Reynolds and G. E. Seay, "Two-Wave Shock Structures in the Ferroelectric Ceramics Barium Titanate and Lead Zirconate Titanate*", Journal of Applied Physics vol. 33, No. 7, Jul. 1962, Los Alamos Scientific Laboratory, Los Alamos, New Mexico.
W. J. Halpin, "Current from a Shock-Loaded Short-Circuited Ferroelectric Ceramic Disk*", Journal of Applied Physics vol 37. No. 1 Jan. 1966, Sandia Laboratory, Albuquerque, New Mexico.
W. Neilson, Bulletin of the American Physical Society, vol. 2, Issue: Month/Year: 1957, pp. 302, Call #: QC1.A56, Location: cp 900000054617, Penn State Annexes.

(Continued)

*Primary Examiner* — Noah Wiese
(74) *Attorney, Agent, or Firm* — McNees Wallace & Nurick LLC

(57) ABSTRACT

A ceramic or single crystal ferroelectric and a method of manufacture are disclosed. The ceramics and single crystals of the present disclosure are located near phase boundaries between ferroelectric and antiferroelectric phases. These ceramics, single crystals, and composite may be used in pulsed power applications.

13 Claims, 6 Drawing Sheets

(56) References Cited

OTHER PUBLICATIONS

Edward F. Alberta and Amar S. Bhalla and T. Takenaka, "The Piezoelectric, Elastic and Dielectric Constants for Ceramics in the Solid Solution: (x) $PbZrO_3$,—(1-x-z) $Pb(Zn_{1/3n}Nb_{2/3})O_3$,—(z) $PbTiO_3$ Ferroelectrics", 1996. vol. 188. pp. 109-124, (in final form Jan. 8, 1996), 1996 OPA Amsterdam B.V. Published in The Netherlands.

D. F. Dzhmukhadze, M. A. Ugryumova, Yu. N. Venevtsev, and G. S. Zhdanov, "The $PbZrO_3$—$SrCu_{1/3}Nb_{2/3}$ system", L. Ya. Karpov Scientific Research Physicochemical Institute, (Submitted Apr. 1, 1972) Kristallografiya, 18, 188-191 (Jan.-Feb. 1973), Sov. Phys. Crystallogr., vol. 18, No. 1, Jul.-Aug. 1973.

Takashi Yamamoto, Satoru Ohashi and Kumao Hisano, "Ferroelectric and Crystallographic Properties of $Pb(Yb_{1/2}Nb_{1/2})O_3$—$PbTiO_3$", Solid Solution System, The National Defense Academy, Yokosuka, 239 Japan (in final form Aug. 24, 1996).

Tadashi Takenaka, Amar S. Bhalla, L. Eric Cross and Koichiro Sakata, "Dielectric, Piezoelectric, and Pyroelectric Properties of Lead Zirconate—Lead Zinc Niobate Ceramics", J. Am. Ceram. Soc., 72 [6] 1016-23 (1989).

D. F. Dzhmukhadze, Yu. N. Venevtsev and G. S. Zhdanov, "The System $PbTio$—$SrCu_{1/3}Nb_{2/3}O_3$", Soviet Physics—Crystallography vol. 16, No. 1 Jul.-Aug. 1971.

Edward F. Alberta, "Relaxor Based Solid Solutions for Piezoelectric and Electrostrictive Applications A Thesis in Materials", Ph.D Dissertation, The Pennsylvania State University, University Park, PA (2003), © 2003 Edward F. Alberta.

\* cited by examiner

HIGH ENERGY DENSITY SHOCK DISCHARGE MATERIALS

CROSS-REFERENCE TO RELATED APPLICATIONS

This application claims priority to U.S. Provisional Patent Application No. 61/261,012 filed on Nov. 13, 2009, entitled "HIGH ENERGY DENSITY SHOCK DISCHARGE MATERIALS" which is herein incorporated by reference in its entirety.

STATEMENT OF FEDERALLY SPONSORED RESEARCH

Portions of the invention disclosed herein were reduced to practice with the support of the US Army Space and Missile Command, Contract No. W9113M-09-C-0011. The U.S. Government may have certain rights in this invention.

FIELD

The present invention is generally directed to energy storage materials and, more particularly, to ceramics and single crystal ferroelectric materials and composites for energy storage.

BACKGROUND

Directed energy technology is being developed for a broad range of applications including both lethal and non-lethal weapons, burst communications, and explosion diagnostics. These systems use a pulse power generator to provide a burst of energy to an energy projection system such as a laser, a radio frequency (RF) antenna, or a microwave frequency (MW) antenna. A variety of generators have been developed for single shot systems. One type, known as a ferroelectric generator (FEG), uses conventional explosives to launch a shock wave into a piece of polarized ferroelectric ceramic. The shock wave causes the ceramic to depolarize, liberating a large amount of charge that is then available to do work such as drive an RF or MW antenna. FEGs are compact, inexpensive power sources that are particularly attractive for highly space-constrained applications.

The current state-of-the-art FEG material is a piezoelectric ceramic based on Type I PZT-Pb$(Zr_{0.52},Ti_{0.48})O_3$. This material is a polycrystalline aggregate that does not completely depolarize during shock, or in other words, the fractional amount of depolarization $\alpha$ that occurs during shock is less than 1. Most often, this material has a moderate remnant polarization $P_r$ of about 20 to 25 $\mu C/cm^2$ (C=coulombs), and a dielectric constant $\in_r$ greater than about 1000. Most Type I PZT-Pb$(Zr_{0.52},Ti_{0.48})O_3$ materials have dielectric breakdown strengths ranging from 30 to 100 kV/cm.

Another FEG material is Pb$(Zr_{0.95},Ti_{0.05})O_3$ ceramic, otherwise known as 95/5 PZT ceramic. This material is not generally available commercially. Like the Type I PZT-Pb$(Zr_{0.52},Ti_{0.48})O_3$ material, 95/5 PZT ceramic is a polycrystalline aggregate of randomly oriented, micrometer-sized crystallites. This material undergoes a phase transition from a polarized ferroelectric state to a non-polarized anti-ferroelectric state during sufficiently strong shock events. This causes complete, instantaneous depolarization, so that the fractional amount of depolarization approaches $\alpha=1$. Also, when this material is doped with a small amount of $Nb^{5+}$ in place of $Zr^{4+}$ and $Ti^{4+}$, the material has a high $P_r$ in the range of 39 to 40 $\mu C/cm^2$. This material also has a lower dielectric constant $\in_r$ in the range of 300 to 400. Similar to the Type I PZT-Pb$(Zr_{0.52},Ti_{0.48})O_3$ materials, this material also has breakdown strengths ranging from 30 to 100 kV/cm.

What is needed to improve FEG performance is a ferroelectric material with improved processing qualities such as resistance to thermal shock, decreased lead volatility, and improved density.

DETAILED DESCRIPTION OF EXEMPLARY EMBODIMENTS

Figure 1:
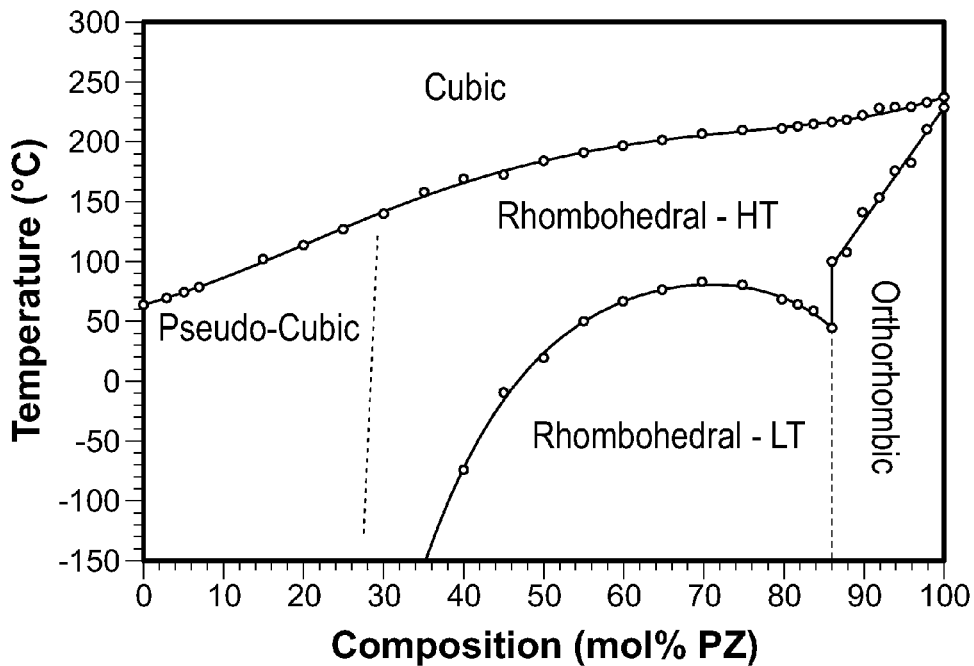
FIG. 1 is a phase diagram of the PIN-PZ solid solution system.

This disclosure provides for a ferroelectric material and method of making a ferroelectric material that has an improved energy density compared to prior 95/5 PZT and Department of Defense (DOD) Type I piezoelectrics. Thermal processing of these prior art piezoelectrics is complicated by several factors, including processing complications from high lead vapor pressure. For example, the high lead vapor pressure of 95/5 PZT requires strict control of sintering conditions. Additionally, 95/5 PZT is prone to thermal shock during sintering.

The open circuit energy density released by a mechanically shocked ferroelectric is given by $$e = \alpha P_r E \quad (1)$$

where e is the energy density in Joules per $cm^3$ of ferroelectric material, $\alpha$ is a fraction between 0 and 1 indicating the amount of depolarization that occurred during the shock, $P_r$ is the ferroelectric's remnant polarization in $C/cm^2$, and E is the electric field in V/cm generated across the ferroelectric by the depolarizing shock. The maximum electric field that can be generated in a shock event is in turn given by $$E = \alpha P_r / \in_r \in_o \quad (2)$$

where $\in_r$ is the relative permittivity (dielectric constant) of the shocked material and $\in_o$ is the permittivity of free space. In practice, E is rarely as high as this equation would suggest and, in practice, is limited by dielectric breakdown strength of the ferroelectric during the shock event (typically 50 to 100 kV/cm).

From equations (1) and (2), it can be seen that a ferroelectric will have a high shock discharge energy density if it 1) has a high $P_r$, 2) has an $\alpha=1$, 3) has a high voltage breakdown strength, and 4) has a low permittivity.

In an embodiment, the compositions of the present invention have similar or increased polarization levels compared to 95/5 PZT and commercial PZT. The compositions of the present disclosure are solid solutions having at least one member that is a relaxor ferroelectric. The solid solution systems have both antiferroelectric and ferroelectric phases. Careful selection of the composition within these systems, allows a material to be obtained that lies very close to the antiferroelectric to ferroelectric phase boundaries, in a manor analogous to 95/5 PZT. Compositions near these phase boundaries are ideal for shock-discharge applications. With appropriate acceptor and/or donor doping, these phase boundary compositions have polarization levels similar to 95/5 PZT, minimized dielectric constants, and undergo complete depolarization in response to shock-wave induced pressure changes.

The compositions of the present disclosure are located near phase boundaries between ferroelectric and antiferroelectric phases such that the application of pressure causes the material to undergo a phase transformation from an initially polarized ferroelectric phase to a non-polarized antiferroelectric phase. The compositions may range from those that are initially ferroelectric to those that are initially antiferroelectric but can be forced into a metastable ferroelectric state by the Application of a suitably high electric field during fabrication. They are suited to pulsed power applications in which the electrical power is delivered via this pressure induced phase change from a ferroelectric to antiferroelectric state. There are several advantages to these compositions compared to typically used 95/5 PZT materials. These include larger energy densities due to the increased polarization levels and decreased dielectric constants; improved temperature stability; the possibility of growing single-crystals; and, in many cases, simpler processing and manufacturing techniques.

In an embodiment, the material has the following composition:

$$(1-x-y)\beta-(x)PbZrO_3-(y)PbTiO_3 \quad \text{(Formula 1)}$$

wherein both x and y range from 0 to 1.

In one embodiment, the material has the following composition:

$$(1-x-y)\beta-(x)PbZrO_3-(y)PbTiO_3 \quad \text{(Formula 2)}$$

wherein both x and y range from 0 to 1.
wherein $\beta=Pb(\varepsilon)O_3$;
wherein $\varepsilon=\beta^I\beta^{II}$, and
wherein $\beta^I$ and $\beta^{II}$ are cations that occupy an octahedral site in a Perovskite crystal structure; and
wherein $\beta^I$ and $\beta^{II}$ have a sum of valences equal to 4.

In an embodiment of Formula 2, $\beta^I$ may be any one member selected from the group consisting of Mg, Ni, Zn, Fe, Sc, Co, Cu, In, Mn, Sb, Lu, Yb, or Y, and $\beta^{II}$ may be any one member selected from the group consisting of Ti, Zr, Nb, Ta, W, Mn, and W.

In an embodiment of Formula 1, where $\beta=Pb(In_{1/2}Nb_{1/2})O_3$. (Formula 3)

In an embodiment of Formula 1, where $\beta=Pb(Yb_{1/2}Nb_{1/2})O_3$. (Formula 4)

In an embodiment of Formula 1, where $\beta=Pb(Yb_{1/2}Nb_{1/2})O_3$. (Formula 5)

In an embodiment of Formula 1, where $\beta=Pb(Zn_{1/2}Nb_{1/2})O_3$. (Formula 6)

In an embodiment of Formula 1, $\beta=Pb(Fe_{2/3}W_{1/3})O_3$. (Formula 7)

In an embodiment of Formula 1, $\beta=Sr(Cu_{1/3}Nb_{2/3})O_3$. (Formula 8)

In an embodiment of Formula 1, $\beta=Bi(Zn_{1/2}Zr_{1/2})O_3$. (Formula 9)

In another embodiment, the material has a formula similar to Formula 2, but with any combination of the compounds of Formulas 3 though 9 substituted partially or fully in place of $Pb(\beta^I\beta^{II})O_3$.

In another embodiment, the material has a formula similar to Formula 2, but with the addition of more than 0 to about 10 mol % Nb, Nd, and/or Mn. In an embodiment, the material has a formula similar to Formula 2, but with the addition of more than 0 to up to and including 10 mol % Nb, Nd, and/or Mn.

In another embodiment, the material has a formula similar to Formula 2, but with lead cation replaced with greater than 0 and up to and including 100 mol % La, Bi, Ba, Sr, and/or Ca.

For example, the material may the following composition:

$$(1-x-y)Pb(\beta^I\beta^{II})O_3-(x)PbZrO_3-(y)PbTiO_3 \quad \text{(Formula 10)}$$

where both x and y range from 0 to 1, and $\beta^I$ and $\beta^{II}$ are cations that occupy the octahedral site in the Perovskite crystal structure. $\beta^I$ and $\beta^{II}$ can be any combination of cations such that the sum of their valences is 4. In an embodiment, the sum of the valences of the cations may be 3 or 4. In one embodiment, $\beta^I$ can be any member of: Mg, Ni, Zn, Fe, Sc, Co, Cu, In, Mn, Sb, Lu, Yb, or Y, and $\beta^{II}$ can be any member of: Ti, Zr, Nb, Ta, W, Mn, and W.

For example, the material may have, but is not limited to, any of the following compositions:

a) Formula similar to Formula 10, but with $Pb(In_{1/2}Nb_{1/2})O_3$ in place of $Pb(\beta^I\beta^{II})O_3$.

b) Formula similar to Formula 10, but with $Pb(Yb_{1/2}Nb_{1/2})O_3$ in place of $Pb(\beta^I\beta^{II})O_3$.

c) Formula similar to Formula 10, but with $Pb(Zn_{1/2}Nb_{1/2})O_3$ in place of $Pb(\beta^I\beta^{II})O_3$.

e) Formula similar to Formula 10, but with $Sr(Cu_{1/3}Nb_{2/3})O_3$ in place of $Pb(\beta^I\beta^{II})O_3$.

f) Formula similar to Formula 10, but with $Bi(Zn_{1/2}Zr_{1/2})O_3$ in place of $Pb(\beta^I\beta^{II})O_3$.

g) Formula similar to Formula 10, but with any combination of the compounds of a) through g) substituted partially or fully in place of $Pb(\beta^I\beta^{II})O_3$.

h) Any of the above formulas 10 and a) through g) with the addition of 0 to 10 mol % Nb, Nd, and/or Mn.

i) Any of the above formulas 10 and a) through g) with lead cation replaced with greater than 0 and up to and including 100 mol % La, Bi, Ba, Sr, and/or Ca.

In one embodiment, the lead titanate ($PbTiO_3$) and lead zirconate ($PbZrO_3$) content in the solid solutions is adjusted so that the resulting final composition remains sufficiently close to the ferroelectric-antiferroelectric phase boundary such that the resulting composition is either ferroelectric, or can be made into a metastable ferroelectric with the application of a sufficiently high polarizing electric field, and can be forced to undergo a phase transition to an antiferroelectric phase with the application of pressure or mechanical shock.

In one embodiment, a ferroelectric generator element having the disclosed composition discussed above can be made in the form of monolithic ceramics, co-fired multi-layer ceramics, single-crystals, composites, or a stack of any one or combination of the aforesaid elements. The elements can also be configured so that the shock wave propagation direction is either perpendicular or parallel to the polarization direction or at any angle between these extremes.

In one embodiment, the ferroelectric ceramics or crystals are synthesized using any number of well-known ceramic powder synthesis, ceramic forming processes, or crystal growth processes. Ceramic powder synthesis processes include mixed oxide or hydroxide or carbonate solid state reaction; sol-gel synthesis; precipitation of hydroxides, carbonates, oxides, and hydroxycarbonates; coprecipitation; hydrothermal synthesis; spray pyrolosis; and flame pyrolosis. Ceramic forming methods include uniaxial dry pressing, cold isostatic pressing, tape casting, freeze casting, injection molding, extrusion, pressure casting, slip casting, sintering, hot pressing, and hot isostatic pressing.

FIG. 1 shows an exemplary embodiment according to the disclosure. The PIN-PZ solid solution is based on the relaxor ferroelectric lead indium niobate (PIN). In solid solutions with lead zirconate and lead titanate the system has been found to have both ferroelectric and antiferroelectric phases. According to the disclosure, a ferroelectric composition lying very close that the ferroelectric to antiferroelectric phase boundary can be found as illustrated by the composition $Pb(In_{1/2}Nb_{1/2})_{0.18}Zr_{0.82}O_3$ (i.e. x=0.820). Undoped PIN-0.82PZ ceramics has a dielectric constant slightly lower than 95/5 PZT (280 v. 300), a dielectric breakdown strength similar to 95/5 PZT (42 v. 46 kV/cm) and a slightly lower piezoelectric coefficient, $d_{33}$ (50 v. 75 pC/N). Explosively depoled samples showed a stored charge of ~0.22 C/m².

Figure 2:
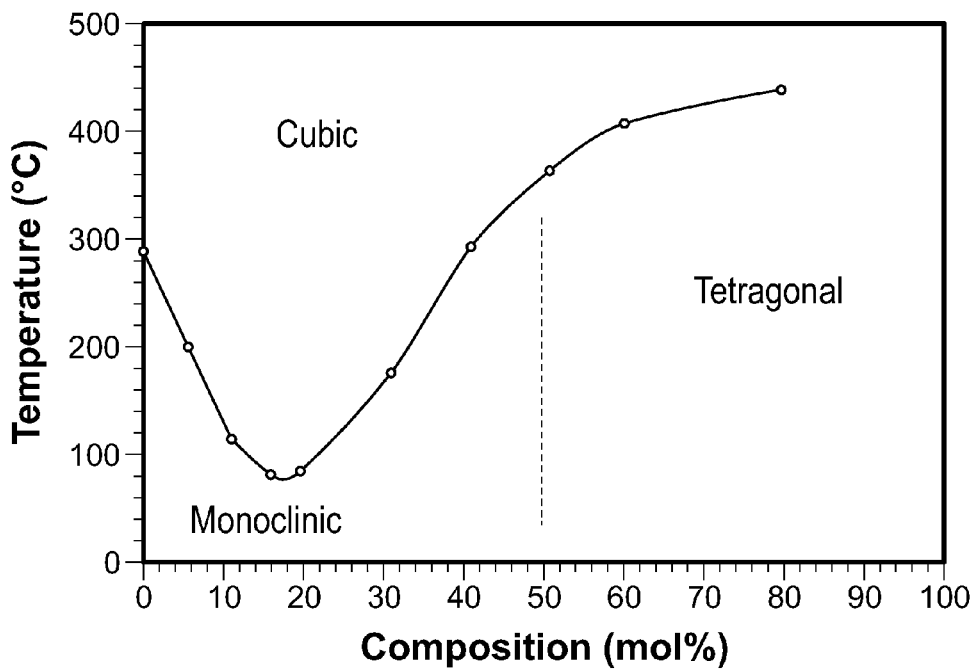
FIG. 2 is a phase diagram for the PYbN-PT solid solution system.

FIG. 2 is a phase diagram for the PYbN-PT solid solution system of exemplary embodiments of the disclosure. As can be seen in FIG. 2, this system has an antiferroelectric phase near PYbN-0.20PT.

Figure 3:
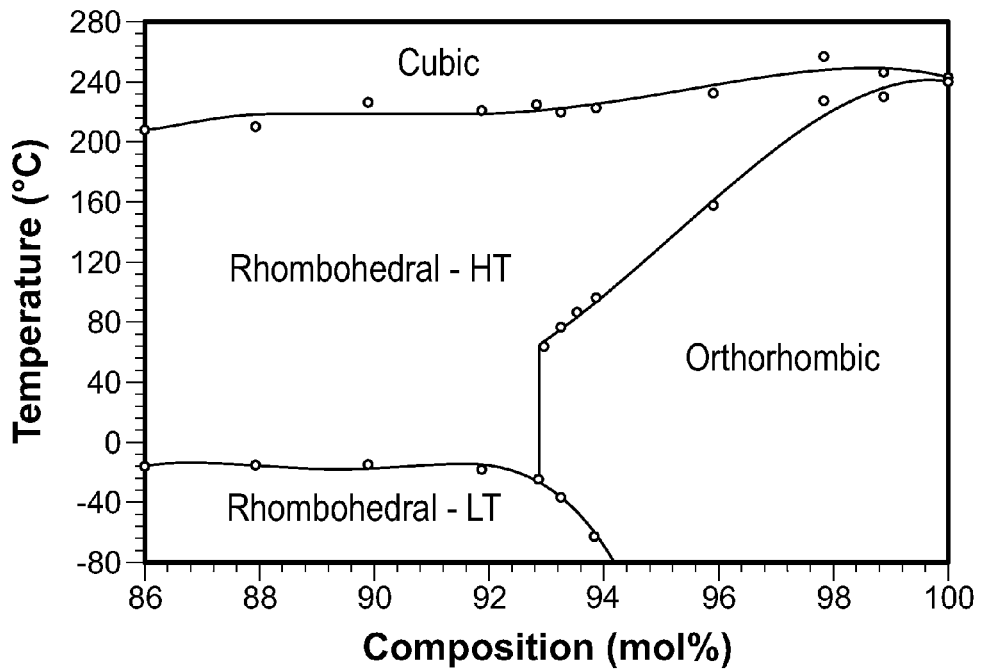
FIG. 3 is a phase diagram of the PZN-PZ solid solution systems.

FIG. 3 is a phase diagram of the PZN-PZ solid solution systems of exemplary embodiments of the disclosure. As can be seen in FIG. 3, there is an orthorhombic antiferroelectric to rhombohedral ferroelectric boundary near PZN-0.93PZ.

Figure 4:
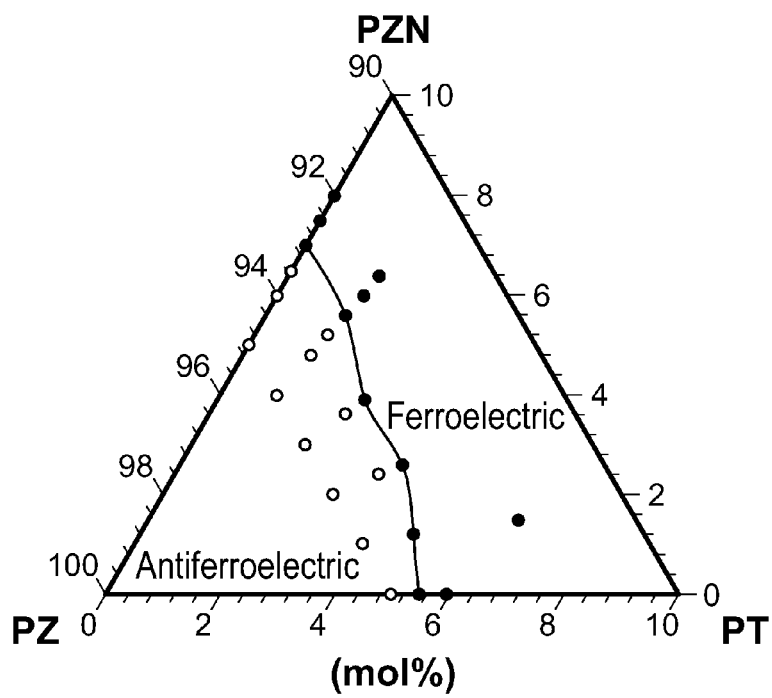
FIG. 4 is a phase diagram of the PZN-PZ-PT solid solution systems.

FIG. 4 is a phase diagram of the PZN-PZ-PT solid solution systems of exemplary embodiments of the disclosure. As can be seen in FIG. 4, the addition of PT to the PZN-PZ solid solution system extends the antiferroelectric to ferroelectric phase boundary from the PZN-0.93PZ composition to the 95/5 PZT composition.

Figure 5:
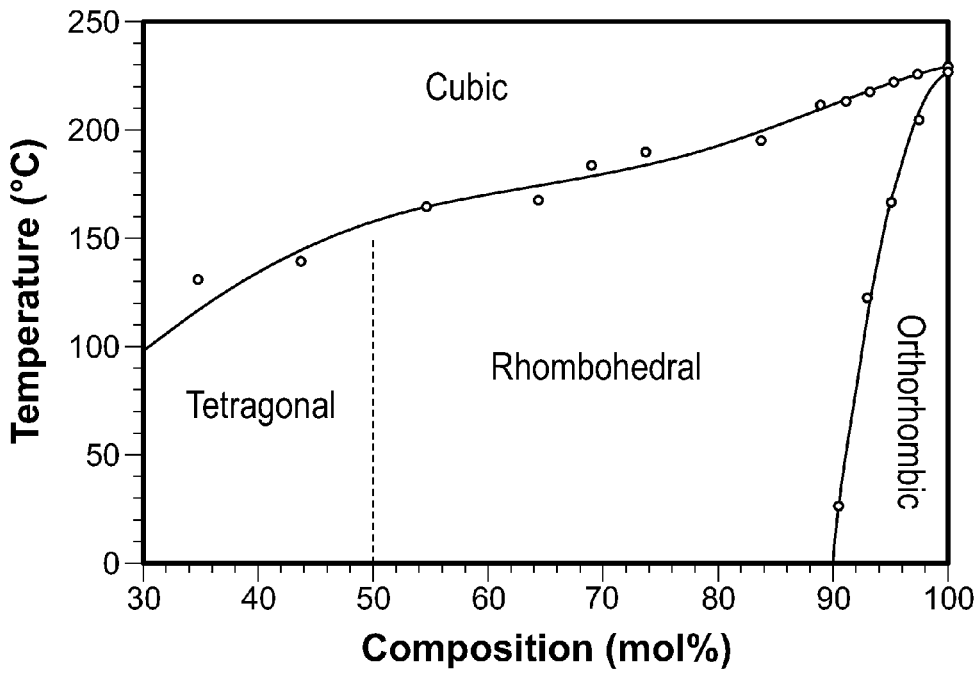
FIG. 5 is a phase diagram of the PFW-PZ solid solution system.

FIG. 5 is a phase diagram of the PFW-PZ solid solution system of exemplary embodiments of the disclosure. As can be seen in FIG. 5, this is another example of a solid solution system with a phase boundary between a ferroelectric and an antiferroelectric phase. In this case occurring near PFW-0.90PZ at room temperature.

Figure 6:
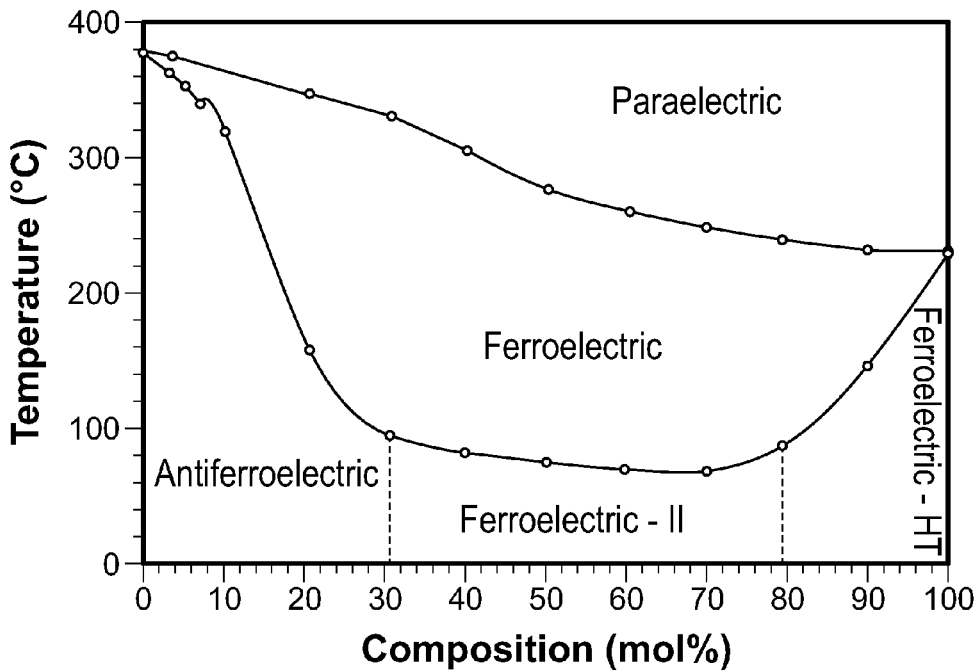
FIG. 6 is a phase diagram of the SCN-PZ solid solution system.

FIG. 6 is a phase diagram of the SCN-PZ solid solution system of exemplary embodiments of the disclosure. As can be seen in FIG. 6, is an example of a solid solution system with a ferroelectric to antiferroelectric phase boundary, in this case near SCN-0.80PZ.

Figure 7:
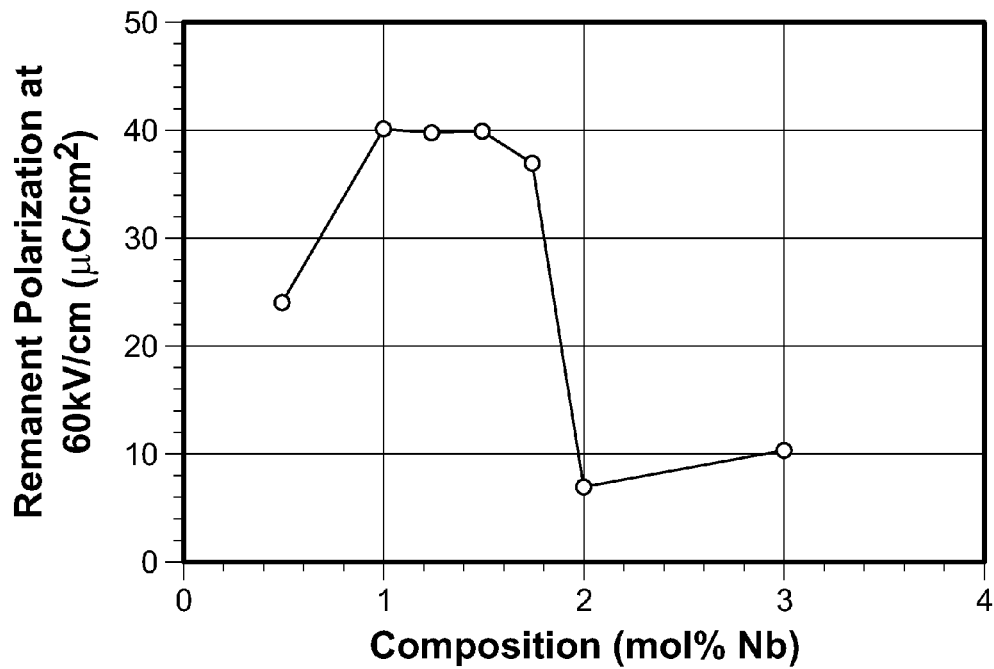
FIG. 7 is a plot of the remnant polarization for Nb-doped PIN-0.82PZ as a function of Nb concentration.

FIG. 7 is a plot of the remnant polarization for a Nb-doped PIN-0.82PZ ceramic as a function of Nb concentration, which illustrates another exemplary embodiment of the disclosure. As can be seen in FIG. 7, remnant polarization varies with the niobium concentration, with the optimum composition being with ca. 1 mol % Nb ($Pb_{0.995}In_{0.1782}Nb_{0.1782}Zr_{0.8118}Nb_{0.01}O_3$). This optimized niobium-doped PIN-PZ composition has a remnant polarization of 0.40 C/m² (as determined from polarization versus electric field hysteresis loops, FIG. 8) and a 1 kHz dielectric constant and loss of 280 and 1.5%, respectively. Explosively-driven shock discharge experiments have shown behavior very similar to 95/5 PZT ceramics with a measured recoverable charge per unit area of ~0.32 C/m² (FIG. 9).

Figure 8:
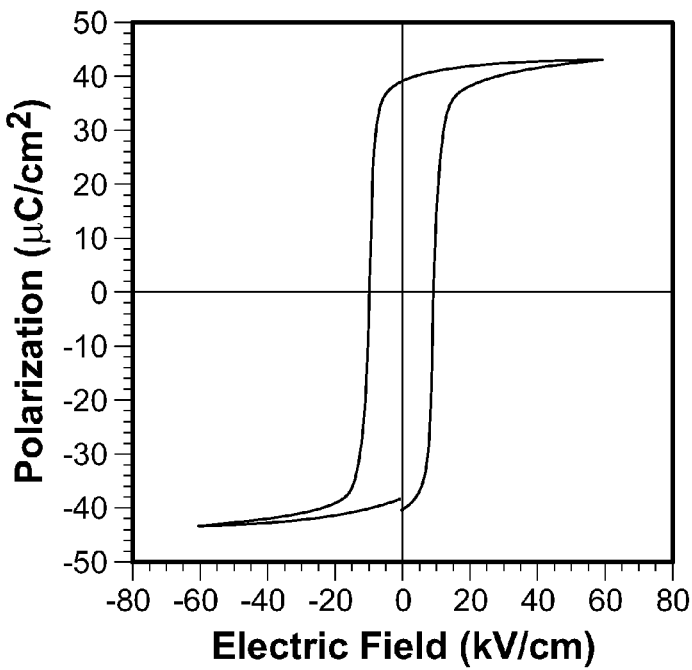
FIG. 8 is a typical P-E hysteresis loop for 1% Nb-doped PIN-0.82PZ.

FIG. 8 is a typical P-E hysteresis loop for 1% Nb-doped PIN-0.82PZ of exemplary embodiments of the disclosure. As can be seen in FIG. 8, the remnant polarization and coercive field are 0.40 C/m² and 14 kV/cm, respectively.

Figure 9:
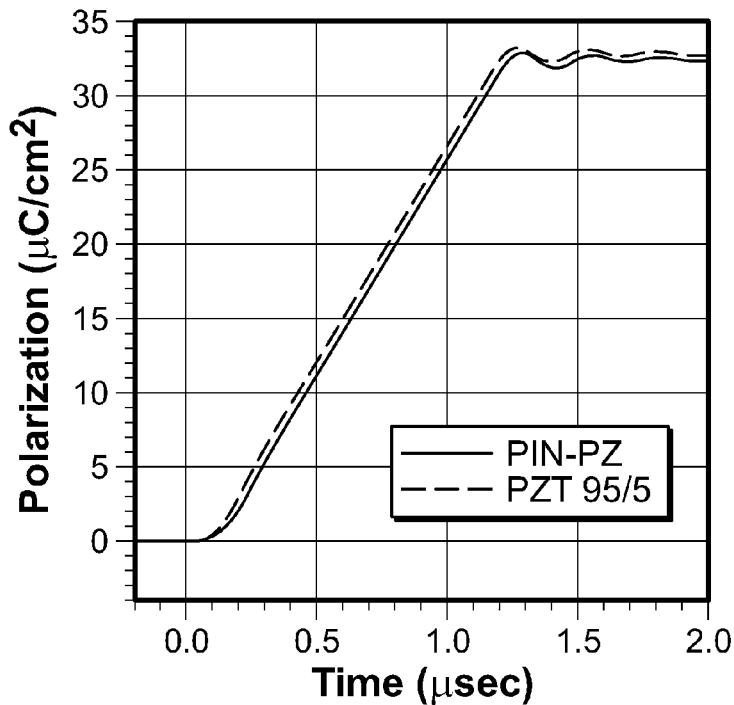
FIG. 9 is a plot of the charge released during an explosively-driven shock depolarization experiment for 1% Nb-doped PIN-0.82PZ and 95/5 PZT.

FIG. 9 is a plot of the charge released during an explosively-driven shock depolarization experiment for 1% Nb-doped PIN-0.82PZ and 95/5 PZT of exemplary embodiments of the disclosure. In this experiment, a small explosive charge was used to generate a high pressure shock wave within the PIN-0.82PZ and 95/5 PZT ceramics. The discharge current was measured and integrated over time to calculate the polarization released during the measurement. The performance of the PIN-0.82PZ and 95/5 PZT compositions are very similar with both of the compositions having recoverable charge per unit area of ~0.32 C/m² and a rise-time of ~1 µpec.

Figure 10:
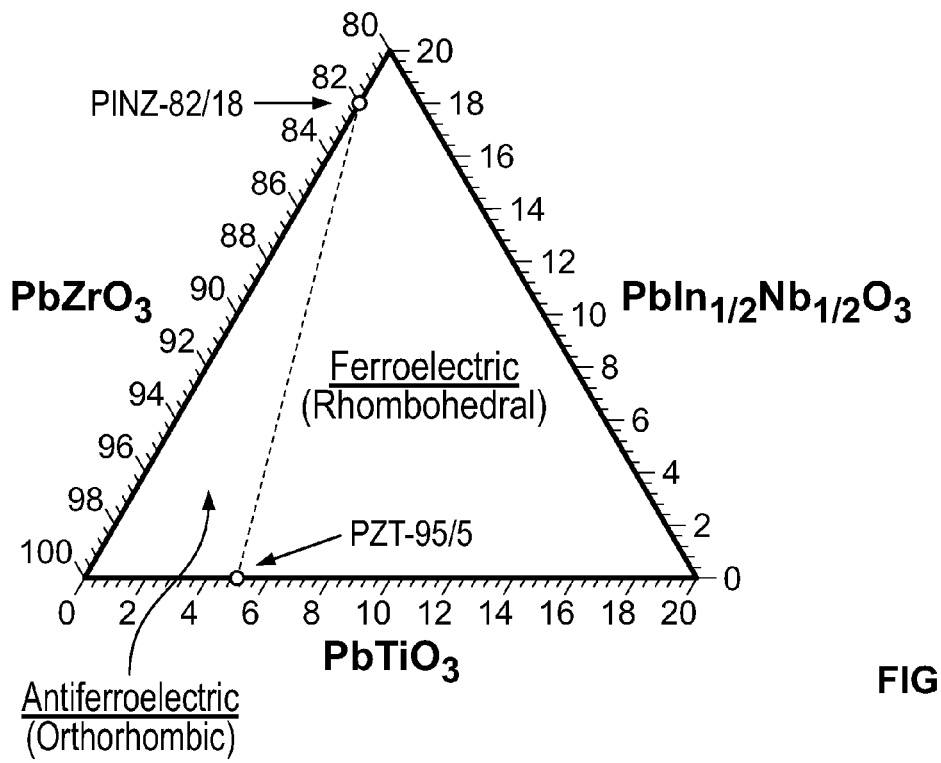
FIG. 10 is a phase diagram of the PIN-PZ-PT ternary solid solution system showing the approximate location of the antiferroelectric to ferroelectric phase boundary extending from Pb$(Zr_{0.95}Ti_{0.05})O_3$ (95/5 PZT) to Pb$(In_{0.09}Nb_{0.09}Zr_{0.82})O_3$ (PINZ-82/18).

FIG. 10 is a phase diagram of the niobium doped PIN-PZ-PT ternary solid solution system. This phase diagram shows the approximate location of the antiferroelectric to ferroelectric phase boundary that extends from $Pb(Zr_{0.95}Ti_{0.05})O_3$ (95/5 PZT) to $Pb(In_{0.09}Nb_{0.09}Zr_{0.82})O_3$ (PINZ-82/18). Compositions formulated to lie on, or near, this phase boundary maintain the high performance levels found in the two end members, 95/5 PZT and PINZ-82/18. They also have several advantages in terms of raw materials cost and ease of processing.

Figure 11:
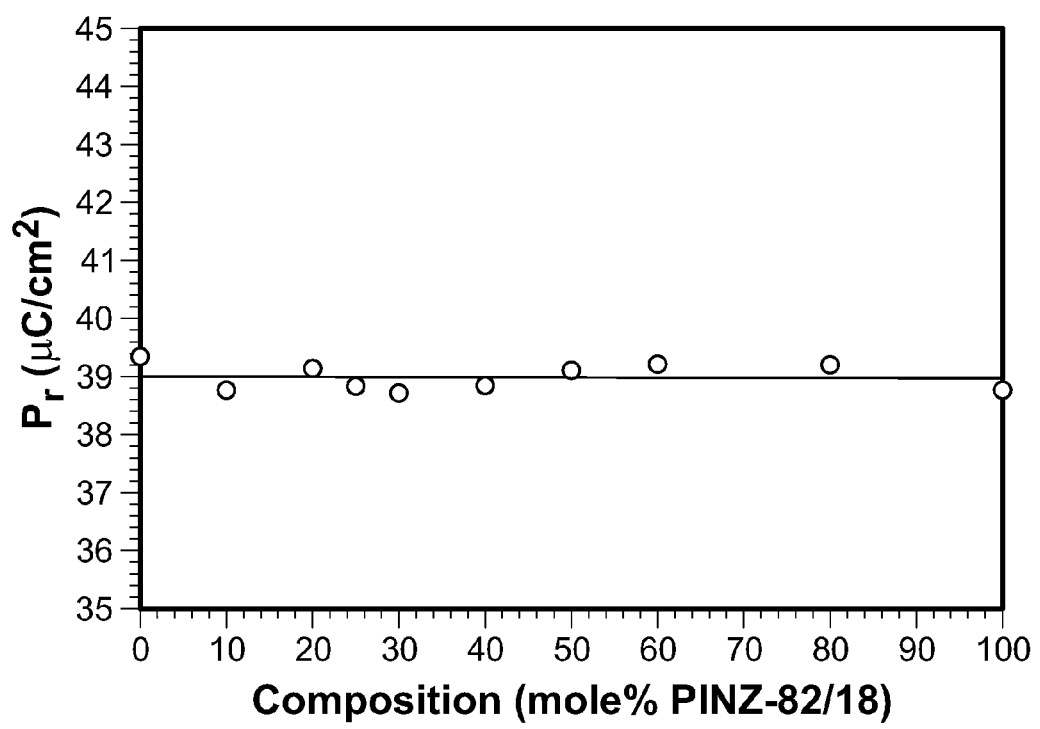
FIG. 11 is a plot of the remnant polarization measured for the compositions located near the AFE-FE phase boundary in the niobium doped PIN-PZ-PT ternary solid solution.

FIG. 11 shows the remnant polarization, as determined by P-E hysteresis measurements, for the compositions located along the antiferroelectric-ferroelectric (AFE-FE) phase boundary in the PIN-PZ-PT ternary solid solution. As can be seen in FIG. 11, the high polarization levels found in 95/5 PZT (~0.40 C/m²) are maintained across the entire range of compositions.

According to another embodiment of the disclosure, a relaxor-based composition is located near antiferroelectric to ferroelectric phase boundaries, which increases the energy density of shock-discharge materials. In one embodiment, the composition is a niobium doped PIN-PZ system. In other embodiments, the composition may include, but is not limited to $Pb(Yb_{1/2}Nb_{1/2})O_3$—$PbZrO_3$—$PbTiO_3$, $Pb(Zn_{1/3}Nb_{2/3})O_3$—$PbZrO_3$—$PbTiO_3$, $Bi(Zn_{1/2}Zr_{1/2})O_3$—$PbZrO_3$—$PbTiO_3$ systems.

The ferroelectric to antiferroelectric phase boundary in this ternary system is located close to a tie-line extending from the PIN-0.82PZ composition to the 95/5 PZT composition. FIG. 11 shows that the remnant polarization remains near 0.40 C/cm² with any amount of PIN-0.82PZ substitution. Therefore, additions of PIN to 95/5 PZT serve to maintain the high performance levels while reducing it's processing and fabrication difficulties.

While the foregoing specification illustrates and describes exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A high energy density material, comprising:
   a material having the general formula selected from the group consisting of $\beta$-PbZrO$_3$, $\beta$-PbTiO$_3$, and $\beta$-PbZrO$_3$—PbTiO$_3$;
   wherein $\beta$=Pb(In$_{1/2}$Nb$_{1/2}$)O$_3$, $\beta$=Bi(Zn$_{1/2}$Zr$_{1/2}$)O$_3$, or $\beta$=Sr(Cu$_{1/3}$Nb$_{2/3}$)O$_3$.

2. The high energy density material of claim 1, where $\beta$=Pb(In$_{1/2}$Nb$_{1/2}$)O$_3$.

3. A high energy density material, comprising a material having the general formula $\beta$-PbZrO$_3$ or $\beta$-PbTiO$_3$, where $\beta$=Pb(Yb$_{1/2}$Nb$_{1/2}$)O$_3$, $\beta$=Pb(Fe$_{2/3}$W$_{1/3}$)$_3$, or $\beta$=Pb(Zn$_{1/2}$Nb$_{1/2}$)O$_3$.

4. The high energy density material of claim 3, where $\beta$=Pb(Yb$_{1/2}$Nb$_{1/2}$)O$_3$.

5. The high energy density material of claim 3, where $\beta$=Pb(Zn$_{1/2}$Nb$_{1/2}$)O$_3$.

6. The high energy density material of claim 3, where $\beta$=Pb(Fe$_{2/3}$W$_{1/3}$)O$_3$.

7. The high energy density material of claim 1, where $\beta$=Sr(Cu$_{1/3}$Nb$_{2/3}$)O$_3$.

8. The high energy density material of claim 1, where $\beta$=Bi(Zn$_{1/2}$Zr$_{1/2}$)O$_3$.

9. The high energy density material of claim 1, wherein a Pb is replaced with greater than 0 and up to and including 100 mol % of a cation of an element selected from the group consisting of La, Bi, Ba, Sr, and/or Ca.

10. The high energy density material of claim 1, wherein a solid solution of the high density material is ferroelectric but close to a ferroelectric-antiferroelectric phase boundary for the high density material.

11. The high density material of claim, 2, having the formula Pb(In$_{1/2}$Nb$_{1/2}$)$_{0.18}$Zr$_{0.82}$O$_3$.

12. A high energy density material, having the formula Pb$_{0.995}$In$_{0.1782}$Nb$_{0.1782}$Zr$_{0.8118}$Nb$_{0.01}$O$_3$.

13. A ferroelectric generator element comprising the high energy density material of claim 1.

* * * * *